ALIGNMENT AND BONDING DEVICE AND METHOD

Filed July 15, 1966 4 Sheets-Sheet 1

INVENTORS
Albert P. Youmans
Alfred L. Greig
BY
Flehr & Swain
Attorneys

INVENTORS
Albert P. Youmans
Alfred L. Greig
BY
Flehr & Swain
Attorneys

ALIGNMENT AND BONDING DEVICE AND METHOD

Filed July 15, 1966 4 Sheets-Sheet 3

INVENTORS
Albert P. Youmans
Alfred L. Greig
BY
Fleht & Swain
Attorneys

INVENTORS
Albert P. Youmans
Alfred L. Greig
BY Flehr & Swain
Attorneys

United States Patent Office 3,388,848

Patented June 18, 1968

3,388,848

ALIGNMENT AND BONDING DEVICE AND METHOD

Albert Peeples Youmans and Alfred Leslie Greig, Cupertino, Calif., assignors to Signetics Corporation, Sunnyvale, Calif., a corporation of California Filed July 15, 1966, Ser. No. 565,489
12 Claims. (Cl. 228—1)

This invention relates to an alignment and bonding device and method and more particularly to an alignment and bonding device and method for use with semiconductor devices.

In upside down bonding or with flip-chip bonding in which a semiconductor device is turned upside down and bonded to areas on a substrate below, as for example, as disclosed in United States Letters Patent No. 3,256,465, there is considerable difficulty in aligning the semiconductor device with the pattern on the substrate because normally the semiconductor device is formed of an opaque material which prevents looking through the semiconductor device to determine whether or not the areas of the semiconductor device are properly positioned to be bonded to the desired areas of the pattern on the substrate. This is particularly true because the alignment is very critical and in many applications must be within one-half a mil. There is, therefore, a need for a new and improved alignment and bonding device and method which facilitates the making of such bonds in semiconductor devices and assemblies.

In general, it is an object of the present invention to provide an alignment and bonding device and method which can be utilized for upside down or flip-chip bonding.

Another object of the invention is to provide an alignment and bonding device and method of the above character in which it is possible to readily make the proper alignments and bonds even though the substrate on which the semiconductor device is to be bonded is opaque and the semiconductor device itself is also opaque.

Another object of the invention is to provide an alignment and bonding device and method of the above character in which beam splitting techniques are utilized.

Another object of the invention is to provide an alignment and bonding device and method of the above character which is very precise.

Another object of the invention is to provide an alignment and bonding device of the above character which can be utilized and operated by relatively unskilled personnel.

Additional objects and features of the invention will appear from the following description in which the preferred embodiments are set forth in detail in conjunction with the accompanying drawings.

Referring to the drawings.

Figure 1:
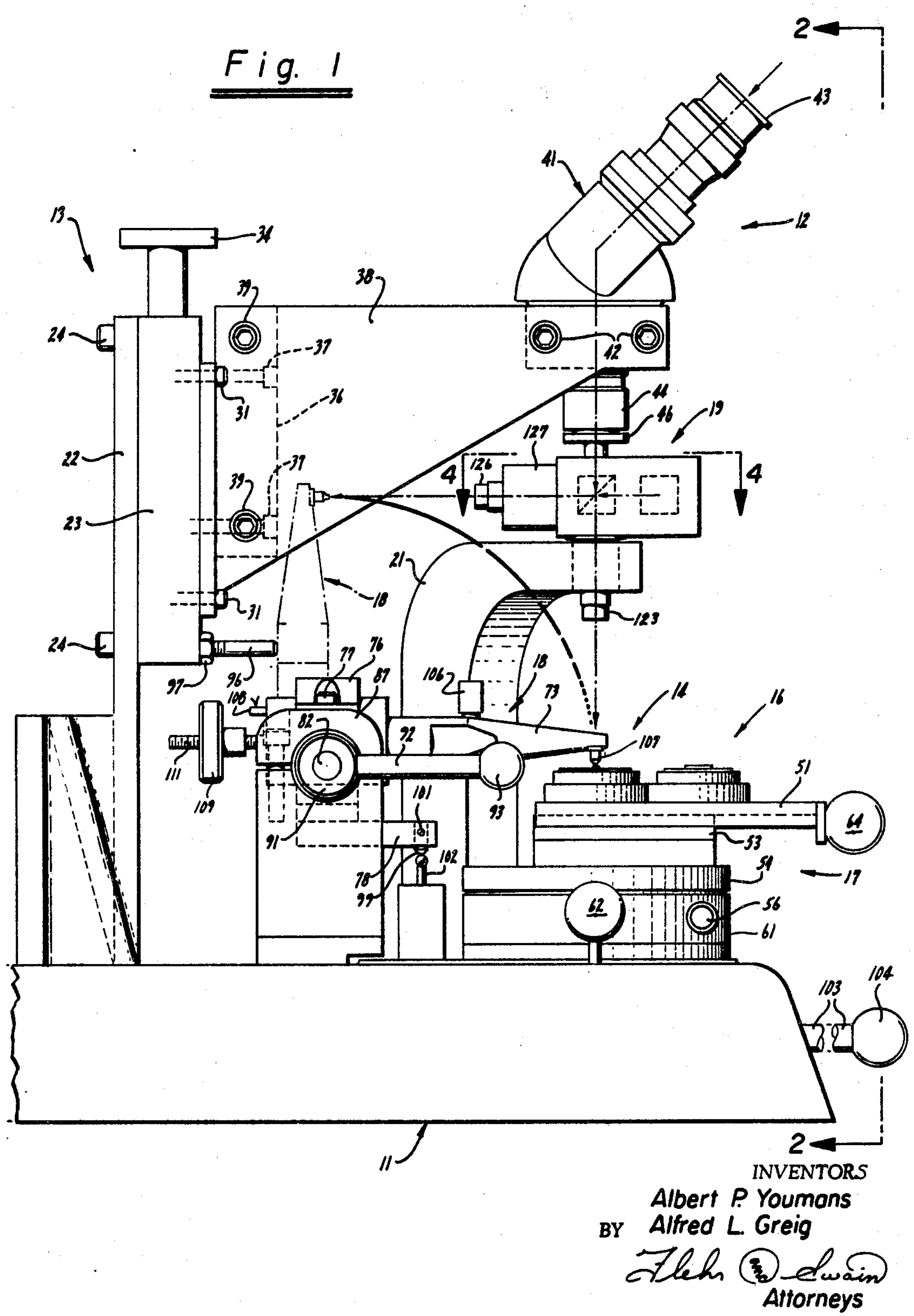
FIGURE 1 is a side elevational view of an alignment and bonding device incorporating the present invention.
Figure 2:
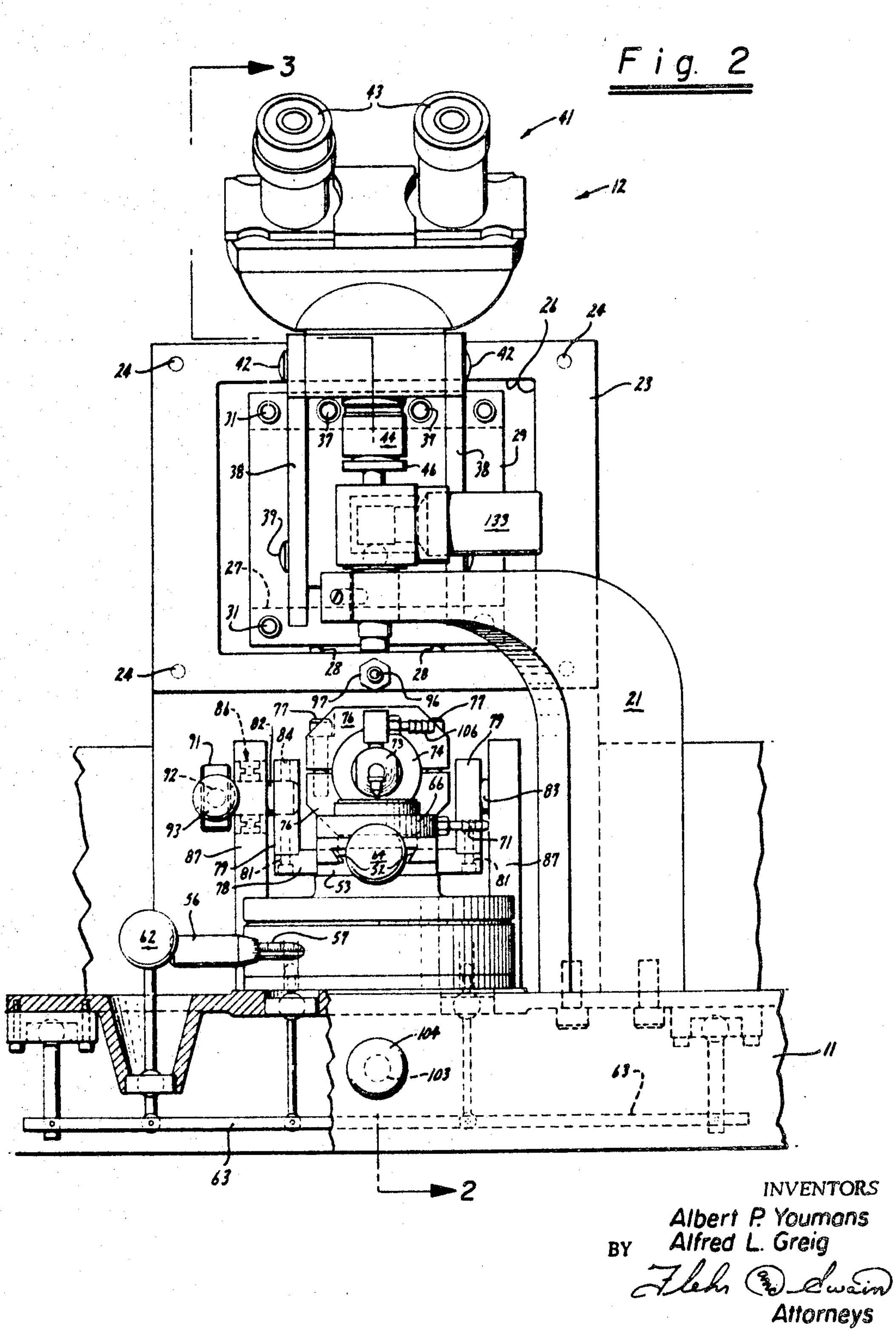
FIGURE 2 is a front elevational view looking along the line 2—2 of FIGURE 1 with certain portions broken away.
Figures 3, 4:
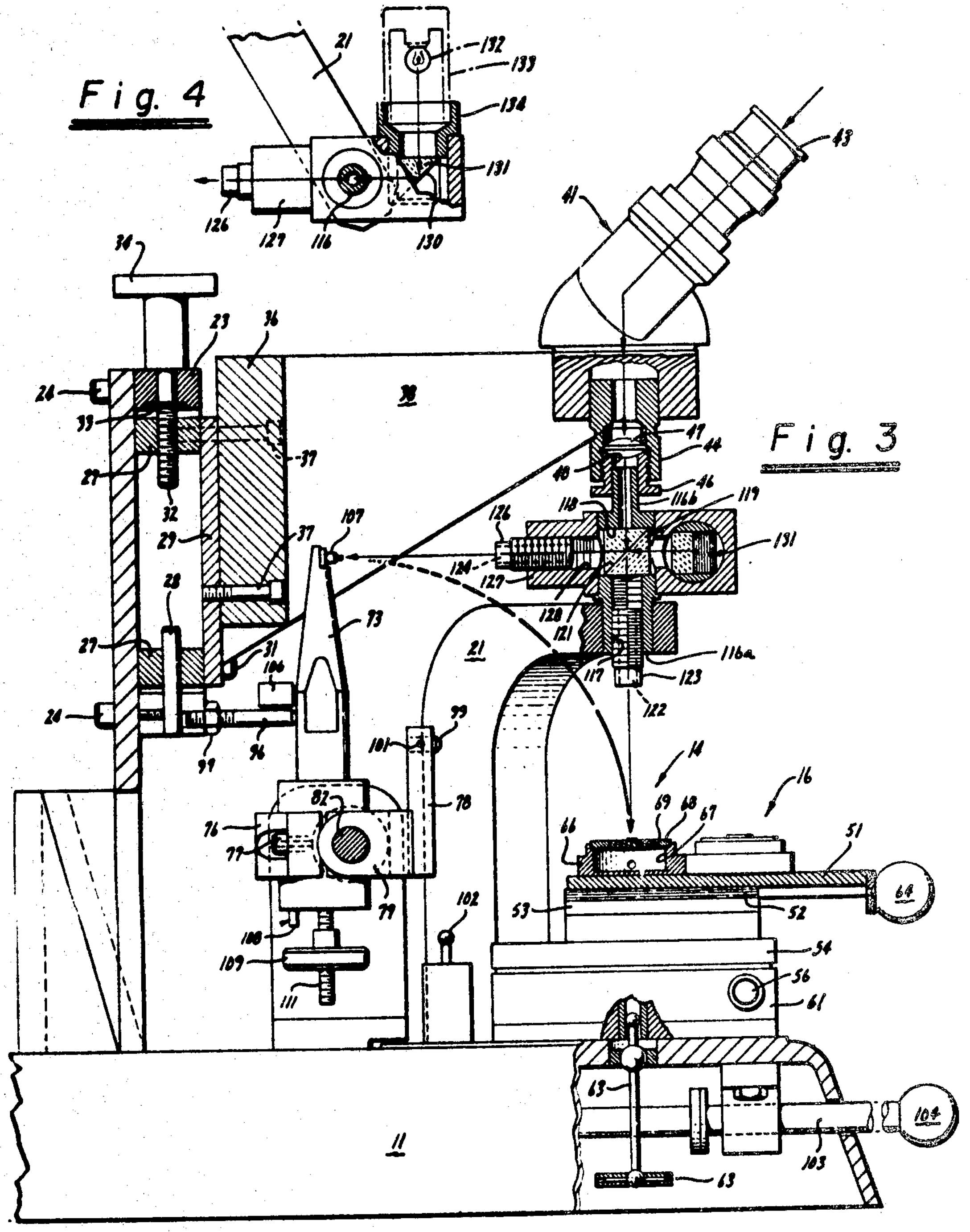
FIGURE 3 is a cross-sectional view taken along the line 3—3 of FIGURE 2 but showing the bonding tool in a raised position.
FIGURE 4 is an enlarged detail view of a portion of the optical assembly utilized in the device shown in FIGURES 1, 2 and 3.

In general, the alignment device is utilized for aligning first and second parts with the first and second parts being spaced apart. Means is provided for supplying light to the parts so that each of the parts reflects light in the form of a light beam. Optical means is also provided for viewing the parts in the spaced apart relationship and forms images of the parts from said light beams. Means is provided for causing relative movement between the first and second parts to bring the images of the parts into alignment with each other so that at least certain parts of the images are in registration. After the images have been aligned, means is provided for bringing the two parts together in actual alignment which is substantially identical to the previous alignment of the images of the parts. Bonding means is also provided for forming a bond between the parts after they have been brought together.

More particularly as shown in the drawings, the alignment and bonding device consists of a base 11. A microscope 12 is mounted upon the base by mounting assembly 13. An alignment stage and a bonding stage 16 are movably mounted upon the base 11 by a mechanism 17. A combination bonding head and vacuum head assembly 18 is also mounted upon the base. A beam splitter and light source assembly 19 is carried by a support arm 21 mounted on the base plate 11.

The base 11 is substantially rectangular and is formed in a suitable manner such as a metal casting. The mounting assembly 13 for the microscope 12 consists of a support plate 22. A support block 23 is secured to the upper portion of the support plate 22 by screws 24. The support block 23 is provided with a rectangular recess 26. A pair of spaced parallel blocks 27 are disposed within the recess 26 and are slidably mounted upon pairs of opposed pins 28 mounted on the upper and lower portions of the support block 23 which extend in a vertical direction facing each other in the recess 26. A plate 29 is secured to the blocks 27 by screws 31.

Means is provided for moving the plate 29 with the blocks 27 secured thereto in a vertical direction on the pins 28 and consists of a screw 32 which is threaded into the upper block 27 and which is rotatably mounted in the block 23 and retained therein by a snap ring 33 and disposed on one side of the upper portion of the block 23 and a knob 34 disposed on the other side of the same upper portion of the block 23. It can be readily seen by rotation of the knob 34, the plate 29 can be shifted vertically within recess 26 upon the pins 28.

A block 36 is secured to the plate 29 by screws 37 and a pair of spaced parallel triangularly shaped plates 38 are mounted on opposite sides of the block 36 and are secured thereto by cap screws 39. A microscope 41 of a conventional type is mounted between the plates 38 and is secured thereto by cap screws 42. As shown in the drawings, the microscope includes a pair of eyepieces 43 and an optical assembly 44 which includes a vertically adjustable member 46 which carries an optical element or lens 47 mounted therein and a passage 48 for the passage of light.

The mechanism 17 which carries the alignment stage 14 and bonding stage 16 consists of a slider 51 which carries both the alignment stage 14 and the bonding stage 16. The slider travels upon spaced parallel ways 52 formed upon a block 53. Means is provided (not shown) for rotatably mounting the block 53 upon a block 54 and includes a control knob 56 connected to a micrometer 57 so that the slider 51 can be rotated through small angular distances by precise amounts. The slider 51 is also provided with a knob 58 so that it also can be shifted back and forth in a horizontal plane on the ways 52.

The block 54 is mounted upon a base bearing support member 61 which is mounted upon the base 11. Means is provided for shifting the block 54 along X and Y axes and includes a control knob 62 which is connected to a linkage 63 for shifting the block 54 and the slider 51 with its alignment stage 14 and the bonding stage 16 in X and Y directions. The means for rotating the slider 51 and the means for moving slider 51 in X and Y directions has not been disclosed in detail because such construction is conventional and is of the type found on bonding machines manufactured and sold by Microtech Manufacturing Company.

The alignment stage 14 and the bonding stage 16 each consists of a block 66 which has recesses 67 therein. A face plate 68 is mounted on the block over the recess and is provided with a plurality of small openings 69 extending through the face plate. A fitting 71 is mounted upon the block 66 and is adapted to be connected to a source of vacuum so that the recess 67 is placed under a vacuum for a purpose hereinafter described. The bonding stage 16 differs from the alignment stage 14 in that heating means has been provided for heating the stage and consists of a heating element 72 provided with leads 73 which are adapted to be connected to a suitable source of power so that the bonding stage can be heated to a predetermined temperature. Sensing means in the form of a thermostat (not shown) can be provided to control the temperature of the bonding stage 16.

The combination bonding head and vacuum head 18 consists of a tapered bonding tool 73 which is carried by a cylindrical base 74. A pair of bracket-like members 76 are clamped to the base 74 by cap screws 77. One of the bracket-like members 76 is secured to a plate 78. A pair of members 79 are secured to opposite ends of the plate 78 by screws 81. Stud shafts 82 and 83 are secured to the members 79 by set screws 84 and are rotatably mounted in ball bearing assemblies 86 carried by spaced parallel vertical posts 87 mounted upon the base plate 11. A collar 91 is mounted on the stud shaft 82 and carries a handle 92 which is provided with a knob 93. By use of the knob 93, it can be seen that the bonding tool 73 can be rotated about an axis formed by the stud shafts 82 and 83.

Means is provided for limiting the movement of the bonding tool and consists of a rear stop in the form of a pin 96 threaded into the block 23 and locked in position by a nut 97. The forward limiting position is controlled by plate 78 which carries an adjustable pin 99 retained therein by a set screw 101. The pin 99 is adapted to engage an initial or first lowering stop pin 102 mounted upon the base plate 11. A mechanism is provided which includes a control level 103 having a control knob 104 thereon by which the pin 102 can be precisely lowered to provide the final lowering for the bonding tool as hereinafter described. The mechanism connecting the lever 103 to the pin 102 is not described in detail because such is conventional, as for example, in a bonding machine of the type manufactured by the Microtech Manufacturing Co.

Means is provided for supplying a vacuum to the bonding tool and includes a fitting 106 mounted on the bonding tool 73 and which is adapted to be connected to a source of vacuum (not shown). The fitting 106 is connected through a passage (not shown) in the bonding tool 73 to a tip 107 which is provided with a very small flat surface having a small hole therein through which air can enter as a vacuum is placed on the fitting 106. The base 74 of the bonding head and vacuum head assembly has a fitting 108 mounted thereon which is adapted to be connected to a suitable source of power. A counterweight 109 is mounted on a screw 111 provided in the base 74 for adjusting the amount of pressure which is applied by the bonding tool during the bonding operation.

The beam splitter and light source assembly 19, which is mounted upon the arm 21, consists of an elongate substantially cylindrical member 116 which has a cylindrical lower portion 116*a* mounted in the support arm 21. The cylindrical member 116 is provided with a vertical passage or bore 117 and a horizontal passage or bore 118 which intersects the passage 117 at right angles. A beam splitter 119 of a conventional type is mounted within the cylindrical member 116 at the intersection of the passages 117 and 118. As is well known to those skilled in the art, the beam splitter 119 is formed by the use of two 90° prisms which are glued together to form a semi-reflecting surface 121 which is inclined at a 45° angle with respect to both the pasasges 117 and 118 and with respect to the upper and lower surfaces of the beam splitter so that by way of example, the light passing through the beam splitter in one direction through one of the passages, 30% is reflected and 30% is transmitted, with the other 40% being lost in absorption. The same is true with respect to light passing through the other of the passages.

A first objective lens 122 (see FIGURE 5) is provided in a lens mount 123 which is threaded into the lower portion of the cylindrical member 116. A second objective lens 124 is carried by a lens mount 126 threaded into one end of a mounting member 127. The mounting member 127 is carried by the cylindrical member 116 and is provided with a passage 128 extending therethrough which is in general alignment with the passage 118 provided in the cylindrical member 116. A prism 131 is mounted in the member 127 so that the prism is in alignment with the passage 128. The prism is provided with a surface 130 which is adapted to reflect light to the beam splitter 119 from a suitable light source, as for example, a lamp 132 mounted within a lamp housing 133 carried by an adaptor 134 mounted upon the member 127. The light is supplied by the beam splitter 119 to the spaced apart parts which are to be aligned as hereinafter explained.

The cylindrical member 116 is provided with a cylindrical extension 116*b* which is adapted to cooperate with the passage 48 provided in the member 46 to form a slide connection between the two members and to permit the member 46 to be adjusted vertically with respect to the member 116.

Operation and use of the alignment and bonding device in performing the method may now be briefly described as follows. Let it be assumed that it is desired to bond an integrated circuit die 141 to a substrate. The integrated circuits previously have been formed in a conventional manner in the die. For example, the integrated circuits can be of the type in which planar diffusion techniques are utilized to diffuse active regions into semiconductor bodies which form the dice to provide transistors and diodes. Metallic heads are formed on the dice and make contact with the active regions. Pads and/or pillars 142 have been provided on the integrated circuit dice and are in contact with the metallic leads. The pads and/or pillars form the means through which electrical contact is made to the integrated circuitry formed by the transistors, diodes and other components.

Let it also be assumed that the pads or pillars of the integrated circuit are to be bonded to a lead arrangement 143 which has been formed on an insulating substrate 144 in a conventional manner and which has been provided with pads or pillars 146 which are adapted to mate with corresponding pads or pillars provided on the die 141. Normally, it is only necessary that pillars be provided either on the die or on the leads to which the die is to be bonded and it is not necessary that they be provided on both the die and the leads on the substrate. The die which is to be bonded to the substrate can be placed directly upon the tip 107 of the bonding tool 73 if the die is of a sufficient size to make this feasible. The die can be placed upon the alignment stage 14 with the integrated circuitry and the pillars of the integrated circuit facing downwardly. The operator then utilizes the eyepieces 43 of the microscope and views the die 16 which is upon the alignment stage 14 which is one of the spaced-apart parts to be aligned and also simultaneously views the tip 107 which is the other of the parts to be aligned; utilizes the knob 56 to rotate the alignment stage 14 and utilizes the knob 62 to move the alignment stage in X and Y directions until the die is in alignment with the tip 107 of the bonding tool 73.

As soon as they are aligned, the knob 93 is grasped and the bonding tool with the tip 107 attached thereto is swung downwardly forwardly until the initial stop 102 is engaged. Thereafter, final lowering is accomplished by manipulation of the knob 104 to bring the tip 107 into direct contact with the back of the integrated circuit dice. When it comes into contact, the vacuum is turned on to the bonding tool 73 so that the die is sucked into engagement with the tip 107. The vacuum can either be applied manually or automatically at the time that the tip 107 comes into engagement with the die.

As soon as the die is attached to the tip 107, the bonding tool 73 is raised manually and moved into a position in which it is in engagement with the stop pin 96.

In the meantime, the substrate to which the die is to be bonded is placed on the bonding stage 16 and is held in a precise position on the bonding stage by a vacuum being applied to the bonding stage. The die in this position is one of the parts to be aligned. The slide 51 carrying the bonding stage is slid inwardly until the bonding stage and the substrate 144 immediately underlie the objective lens 122. The substrate 144 is the other part to be aligned. When this is the case, it is possible by using the microscope to see both the pattern of the leads on the substrate and also to see the pattern of the integrated circuitry on the die carried by the tip 107 even though they are spaced apart from each other and are separated by 90°. Since the two patterns are generally superimposed upon each other, it is possible to bring at least portions of the patterns into exact alignment by utilizing the knob 56 for rotating the stage and the knob 62 for moving the stage in X and Y directions. As soon as the desired portions are in exact alignment, the bonding head 73 is again swung downwardly until it engages the stop 102. Final lowering is again accomplished by use of the knob 104 to bring the parts together or, in other words, to move the die into contact with the substrate so that they have the same actual alignment as the images had. Ultrasonic energy can then be applied to the bonding tool 73 to cause bonds to be established between the die and the substrate as explained in Patent No. 3,255,511. The ultrasonic equipment utilized can be any suitable type such as that manufactured by Sonobond Corporation. If desired, as pointed out previously, the bonding stage can be heated to facilitate the formation of the ultrasonic bonds. As soon as the bond has been formed, the vacuum is removed from the bonding head 73 and the bonding head is raised and returned to its position in which it is at rest against the backstop 96.

As is appreciated by those skilled in the art of ultrasonic bonding, the power required, the temperatures and the weights utilized can vary widely depending upon the materials being utilized. In general, power settings ranging from 6–12 watts are conventionally used. Temperatures ranging from 300° to 400° C. can be used, and weights from 100–450 grams can be readily used in connection with forming bonds with integrated circuitry.

When solder bumps or pillars are being utilized on the integrated circuitry on the substrates, relatively low amounts of ultrasonic energy can be utilized. For example, the ultrasonic energy can be utilized for tacking the die to the substrate and thereafter running the assembly through a heat cycle so that the solder melts and flows and forms a true metallurgical bond.

Figures 5, 6:
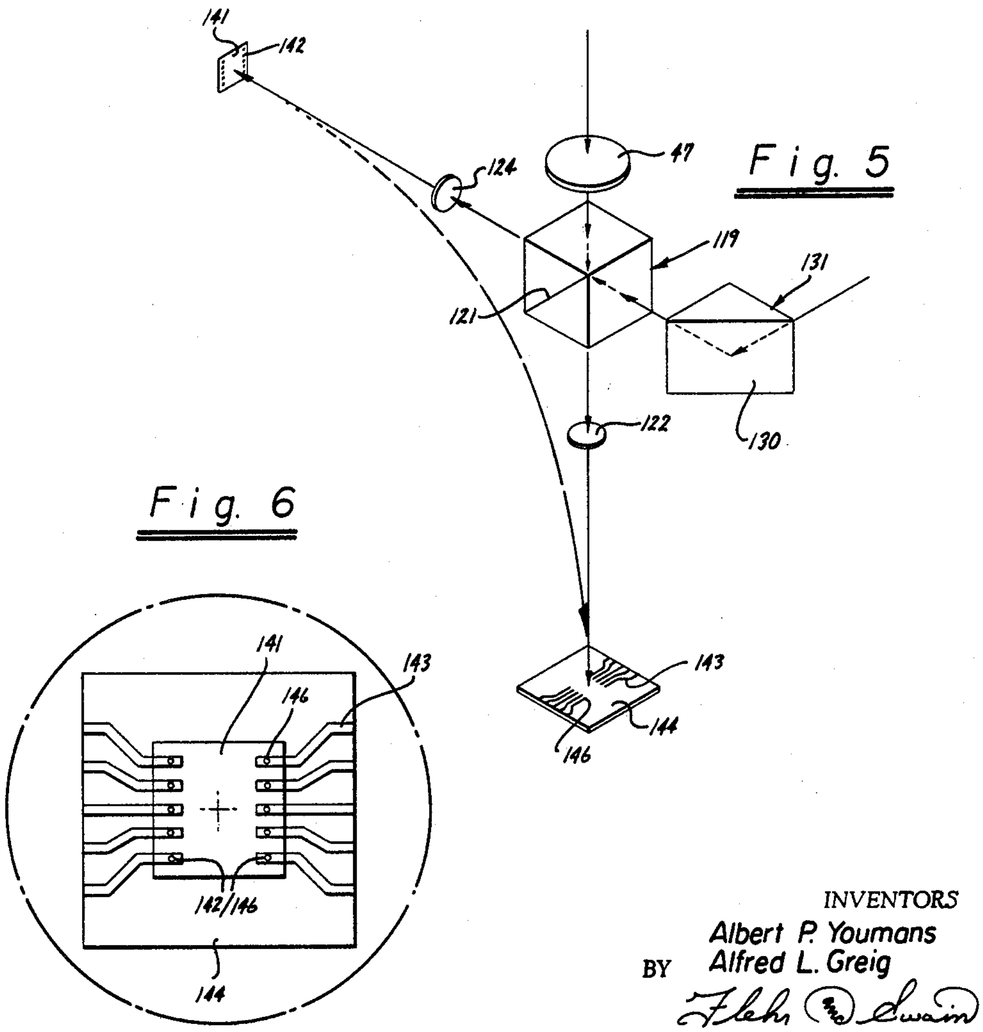
FIGURE 5 is a schematic illustration of the optical elements and their positioning.
FIGURE 6 is an illustration of a typical view which can be seen through the microscope during an alignment step.

The principal feature of the present invention which makes the present method feasible is the use of the unique optical arrangement which is illustrated schematically in FIGURE 5. Light is supplied to the two spaced-apart parts 141 and 144 from the light source 132 through the beam splitter 119 so that light beams are reflected by the parts to form generally superimposed images thereof in the optical system. Light reflected by the substrate 144 passes through the objective lens 122 into the beam splitter 119. A portion of this reflected light is transmitted upwardly through the secondary optics including the lens 44 of the microscope 12. Light reflected by the die 141 passes through the second objective lens 124 into the beam splitter 121. A portion of this light is reflected into the secondary optics so that when looking through the eyepieces 43 of the microscope, light reflected from both the substrate 144 and from the die 141 can be seen simultaneously with one generally superimposed on the other.

With the arrangement of the parts shown in the drawings, it can be seen that it is unnecessary to shift the position of the beam splitter 119 when the bonding operation is made. In other words, the movement of the bonding head clears the optical system which is utilized for the alignment. In order to do this, it is necessary that the die 141 and the substrate 144 be separated by a relatively large distance and by 90°. However, because of this rather long working distance, it is necessary that secondary optics in the form of the lens 47 be provided for the microscope to increase the magnification.

As pointed out previously, beam splitter 119 is of a type which reflects approximately as much light as it transmits so that there are substantially equal intensities of light in the microscope so that the image from one does not appear stronger than the other. However, it should be pointed out that if the die 141 or the substrate 144 had different reflectance characteristics, the light from the die 141 and the substrate 144 will not be equal. When such is the case, it will be necessary to utilize a secondary light source and to shine it directly on either the die 141 or the substrate 144 at an angle to compensate for the difference reflection characteristics. Alternatively, light from two separate sources can be directed onto the substrate and the die to accomplish the desired lifting effect without directing light through the optics.

With the device shown, it can be seen that it is possible to accomplish a precise alignment of two parts which are separated by a substantial distance from each other and in which the images from the two parts are taken and superimposed optically in such a manner that they give an appearance which is exactly the appearance they will have when the two parts are bonded together. This is true even though the two parts are opaque.

It also will be noted that the light being reflected from the two separated parts is being reflected at right angles to the parts so that it is not necessary that the microscope have a large depth of field. This permits higher magnification to be used because careful control of the depth of field is not required. The lens 47 acts as a secondary objective for the images which are supplied to it by the beam splitter.

The microscope is focused by utilization of the knob 34, whereas the objective lens 122 and 124 can be focused by adjusting the mounts in which they are mounted.

By way of example, it has been possible to form excellent assemblies in which integrated circuits have been bonded to substrates in which the pillars utilized have an area of approximately 3–4 mils which are bonded to pads of 3 mils in diameter. The spacing between the pillars and the pads has been as close as ½ mil which has required accuracies of ¼ of a mil. No difficulty has been found in designing the device so that the variation in accuracy of the swinging of the bonding tool 73 varied less than .1 of a mil.

Figure 7:
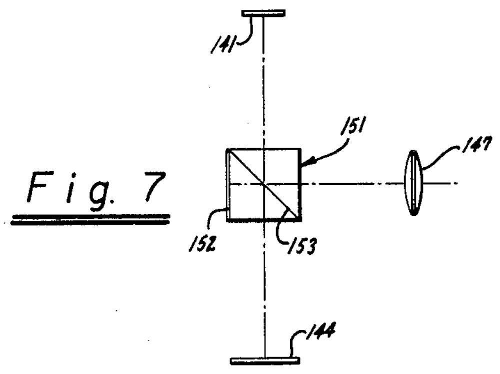
FIGURE 7 is a schematic illustration of another embodiment of the invention having the positions of the optical elements.

Although the alignment and bonding device and method have been described in an arrangement in which the two parts to be aligned have been spaced apart and separated by 90°, it is also possible to utilize other geometries; for example, as shown in FIGURE 7, 180° geometry can be utilized. In such an arrangement, the die 141 is positioned immediately above the substrate 144. A beam splitter 151 has been provided which has been modified slightly in that a silver surface 152 which forms an angle of 45° with the semi-reflecting inner surface 153. Light reflected from the part 141 strikes the beam splitted 151 and a portion of this light is reflected through 90° into the second objective lens 147. Light from the part 144 is reflected by the beam splitter 151 to the silver surface 152 where it is directly reflected and a portion of this passes through the beam splitter to the lens 147 to thereby provide at 147 images of both the parts 141 and 144. Alignment may then be accomplished in the same manner as hereinbefore described with the previous device. However, if the arrangement shown in FIGURE 7 is utilized, it is necessary to provide means, as for example, a mount permitting pivotal movement of the beam splitter 151 so that the beam splitter 151 can be moved to an out-of-the-way position during the time the bonding tool is utilized to bring the two parts together to form the bond. As soon as the bond has been completed, the bonding tool can be returned to its home position and the beam splitter returned, and the same procedure repeated.

One additional disadvantage of the arrangement shown in FIGURE 7 is that the beam passing from the part 144 must pass through the beam splitter twice and, therefore, there will be a double loss of light and a less brilliant image at 147 assuming that the reflectance from parts 141 and 144 is identical. This can be compensated for by giving brighter illumination to the part 144 so that the image, even after it has passed through the beam splitter twice, is of the same intensity as the image from the part 141.

It is apparent from the foregoing that there has been provided a new and improved alignment and bonding device which is particularly adapted for aligning two parts which are to be bonded together even though they are opaque. The device is of a type which can be operated effectively to form the bonds rapidly and, in addition, can be operated by relatively unskilled personnel.

We claim:

1. In an alignment device for aligning first and second parts with said first and second parts being spaced apart, means for supplying light to the parts so that each of the parts reflects light in the form of a light beam, optical means for viewing said parts in said spaced-apart relationship and forming images of said parts from said light beams, and means for causing relative movement between the parts to bring the images of the parts into alignment with each other so that at least certain parts of the images are in registration.

2. A device as in claim 1 wherein said optical means includes a beam splitter.

3. A device as in claim 1 wherein said first and second parts are positioned so that the light beams reflected from the parts form an angle of substantially 90° with respect to each other and wherein said optical means includes a beam splitter having an inclined surface inclined at an angle of substantially 45° with respect to each of said reflected beams.

4. A device as in claim 1 wherein the first and second parts are positioned so that the beams of light reflected from said first and second parts form an angle of substantially 180° with respect to each other and wherein said optical means includes a beam splitter having a reflecting surface forming an angle of substantially 45° with respect to said beams and wherein said beam splitter is provided with an additional reflecting surface forming an angle of substantially 45° with respect to the first named reflecting surface.

5. A device as in claim 1 together with means for bringing the two parts together after their images have been aligned so that their actual alignment is substantially identical to the previous alignment of the images of the parts.

6. A device as in claim 5 wherein said means for bringing the parts together consists of means for causing relative movement between the parts of 90°.

7. A device as in claim 5 together with means for forming at least one bond between the two parts after they have been brought together.

8. In an alignment and bonding device for use in bonding a semiconductor device to a substrate in which the semiconductor device has a predetermined lead pattern and wherein the substrate has a lead pattern formed thereon, means for holding said device and said substrate in spaced-apart positions, means for supplying light to the parts so that light is reflected from the parts in the form of light beams, optical means for viewing said device and said substrate in said spaced-apart relationship and forming superimposed images of said device and said substrate from said light beams, and means for causing relative movement between the device and the substrate to bring the images of the device and substrate into alignment so that at least certain portions of the lead patterns of the substrate and the device are in registration with each other.

9. A device as in claim 8 wherein said means for holding said device and said substrate in a spaced-apart position includes means for bringing the device and the substrate together in a relationship which is substantially identical to the relationship of the aligned images, together with means for forming a bond between the lead pattern of the substrate and the device after they have been brought together.

10. In a method for aligning first and second parts, positioning the first and second parts in a spaced-apart relationship, forming by the use of optical means two separate superimposed images of said first and second parts and causing relative movement between the parts and viewing the images of the same to bring at least certain portions of the parts into alignment with each other.

11. A method as in claim 10 together with the step of bringing the parts together after they have been aligned so that they have the same alignment as said aligned images.

12. A method as in claim 10 together with the step of bonding the two parts together after they have been brought together.

References Cited

UNITED STATES PATENTS

| | | | |
|---|---|---|---|
| 3,263,057 | 7/1966 | Conti | 219—78 |
| 3,149,510 | 9/1964 | Kulicke | 228—3.5 |

RICHARD H. EANES, Jr., *Primary Examiner.*